United States Patent
Peake

(10) Patent No.: US 11,335,677 B2
(45) Date of Patent: May 17, 2022

(54) COMBINED MCD AND MOS TRANSISTOR SEMICONDUCTOR DEVICE

(71) Applicant: NEXPERIA B.V., Nijmegen (NL)

(72) Inventor: Steven Peake, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 17/075,960

(22) Filed: Oct. 21, 2020

(65) Prior Publication Data

US 2021/0134792 A1 May 6, 2021

(30) Foreign Application Priority Data

Oct. 30, 2019 (EP) .................................... 19206163

(51) Int. Cl.
| | | |
|---|---|---|
| *H01L 27/07* | (2006.01) | |
| *H01L 21/8234* | (2006.01) | |
| *H01L 29/40* | (2006.01) | |
| *H01L 29/417* | (2006.01) | |
| *H01L 29/423* | (2006.01) | |

(52) U.S. Cl.
CPC .. *H01L 27/0727* (2013.01); *H01L 21/823418* (2013.01); *H01L 21/823462* (2013.01); *H01L 21/823475* (2013.01); *H01L 29/401* (2013.01); *H01L 29/41775* (2013.01); *H01L 29/4236* (2013.01)

(58) Field of Classification Search
CPC ........... H01L 27/0727; H01L 29/41775; H01L 29/4236; H01L 21/823418
See application file for complete search history.

(56) References Cited

U.S. PATENT DOCUMENTS

| | | | |
|---|---|---|---|
| 8,907,413 B1 | 12/2014 | Jin | |
| 9,570,605 B1* | 2/2017 | Peake | .................. H01L 29/7813 |
| 2013/0105886 A1 | 5/2013 | Lui et al. | |
| 2021/0159336 A1* | 5/2021 | Stamper | ................ H01L 29/665 |
| 2021/0320180 A1* | 10/2021 | Chen | ..................... H01L 29/785 |

FOREIGN PATENT DOCUMENTS

| | | |
|---|---|---|
| EP | 1168455 A2 | 1/2002 |
| EP | 3244452 A1 | 11/2017 |

OTHER PUBLICATIONS

Extended European Search Report for priority European application No. EP19206163.8, 8 pages, dated May 13, 2020.

\* cited by examiner

*Primary Examiner* — Joseph C. Nicely
(74) *Attorney, Agent, or Firm* — Ohlandt, Greeley, Ruggiero & Perle, LLP

(57) ABSTRACT

This disclosure relates to a combined MOS controlled diode (MCD) and MOS transistor semiconductor device and associated method of manufacture. The semiconductor device includes an epitaxial semiconductor layer arranged on a semiconductor substrate and a matrix of trenches formed in the epitaxial layer, with the matrix of trenches including a first plurality of spaced apart parallel trenches and a second plurality of spaced apart parallel trenches. Each of the first plurality of parallel trenches is orthogonal to each of the second plurality of parallel trenches and gate electrodes are arranged in each of the first plurality of spaced apart parallel trenches. Source electrodes are arranged in each of the second plurality of spaced apart parallel trenches.

16 Claims, 4 Drawing Sheets

COMBINED MCD AND MOS TRANSISTOR SEMICONDUCTOR DEVICE

CROSS REFERENCE TO RELATED APPLICATION

This application claims the benefit under 35 U.S.C. § 119(a) of European Application No. 19206163.8 filed Oct. 30, 2019 the contents of which are incorporated by reference herein in their entirety.

BACKGROUND OF THE DISCLOSURE

1. Field of the Disclosure

The present disclosure relates to semiconductor device. In particular this disclosure relates to a combined MOS controlled diode and MOS transistor semiconductor device and associated method of manufacture.

2. Description of the Related Art

In switching semiconductor devices such as MOSFETs power losses can arise in two main ways. Firstly, the inherent on-resistance, known as RDS(ON) dissipates power during operation of the MOSFET and the larger the transistor, the lower the RDS(ON) and therefore less power will be dissipated in the device. Secondly, as the MOSFET switches the intrinsic parasitic capacitance stores and then dissipates energy during each switching operation. These capacitive losses are proportional to the switching frequency of the MOSFET during operation and the value of the parasitic capacitance in the MOSFET. As the size of the MOSFET increases its intrinsic parasitic capacitance also increases such that increasing the MOSFET size also increases the switching loss.

As a result of these losses, there is therefore a trade-off between $R_{DS(ON)}$ and intrinsic parasitic capacitance. While a larger MOSFET will exhibit lower $R_{DS(ON)}$ and consequently lower conduction loss, the larger MOSFET increases parasitic capacitance and therefore increasing the switching loss. To overcome these losses, trench MOSFETs may have a low $R_{DS(ON)}$ at the expense of a large area between the gate, drain, and source, which results in larger parasitic capacitance.

One known way to lower the parasitic capacitance is the integration of a so-called MOS Controlled Diode (or MCD) on to the MOSFET die. The area taken up by the MCD to the MOSFET active area should ideally be equal, that is the ratio should be 1 or in percentage terms 100%. For a fixed current rating to integrate the MCD onto the same die as the MOSFET would require an increase in MOSFET die area is required to accommodate the MCD. Known systems use small ratio of about 20% because the cost of using increasing the active area is prohibitive in terms of device size.

SUMMARY

Various example embodiments are directed to issues such as those addressed above and/or others which may become apparent from the following disclosure concerning improving switching loss in MOSFET devices.

In certain example embodiments, aspects of the present disclosure involve improving the trade-off between $R_{DS(ON)}$ and intrinsic parasitic capacitance.

According to an embodiment there is provided a combined MOS controlled diode (MCD) and MOS transistor semiconductor device, comprising: an epitaxial semiconductor layer arranged on a semiconductor substrate; a matrix of trenches formed in the epitaxial layer, the matrix of trenches comprising a first plurality of spaced apart parallel trenches and a second plurality of spaced apart parallel trenches, wherein each of the first plurality of parallel trenches is orthogonal to each of the second plurality of parallel trenches; gate electrodes arranged in each of the first plurality of spaced apart parallel trenches; and source electrodes arranged in each of the second plurality of spaced apart parallel trenches.

The semiconductor device further comprises a first oxide layer formed in the first plurality of spaced apart parallel trenches and a second oxide layer formed in the second plurality of spaced apart parallel trenches.

The gate electrodes may be insulated from the epitaxial semiconductor layer by the first oxide layer and the source electrodes may be insulated from the epitaxial semiconductor layer by second oxide layer. The gate electrodes may be insulated from the source electrodes by the first oxide layer and the second oxide layer.

The gate electrodes may be continuous along the length of the each of the first plurality of spaced apart parallel trenches, and the source electrodes may be split along the length of each the second plurality of spaced apart parallel trenches.

The first plurality of spaced apart parallel trenches define a first cell pitch and the second plurality of spaced apart parallel trenches defines a second cell pitch. The first cell pitch is the pitch of the MOS controlled diode and the second cell pitch is the pitch of the MOS transistor.

According to embodiments there is also provided a method of manufacturing a combined MOS controlled diode (MCD) and MOS transistor semiconductor device, the method comprising: forming an epitaxial semiconductor layer on a semiconductor substrate; forming a matrix of trenches formed in the epitaxial layer, the matrix of trenches comprising a first plurality of spaced apart parallel trenches and a second plurality of spaced apart parallel trenches, wherein each of the first plurality of parallel trenches is orthogonal to each of the second plurality of parallel trenches; forming gate electrodes in each of the first plurality of spaced apart parallel trenches; and forming source electrodes in each of the second plurality of spaced apart parallel trenches.

The method may further comprise forming a first oxide layer in the first plurality of spaced apart parallel trenches and forming a second oxide layer in the second plurality of spaced apart parallel trenches.

The gate electrodes may be formed to be insulated from the epitaxial semiconductor layer by the first oxide layer and the source electrodes are formed to be insulated from the epitaxial semiconductor layer by second oxide layer.

The gate electrodes may be formed to be insulated from the source electrodes by the first oxide layer and the second oxide layer.

Forming the gate electrodes to be continuous along the length of the each of the first plurality of spaced apart parallel trenches, and forming the source electrodes to be split along the length of each the second plurality of spaced apart parallel trenches.

The first plurality of spaced apart parallel trenches to define a first cell pitch and forming the second plurality of spaced apart parallel trenches to define a second cell pitch.

The first cell pitch is the pitch of the MOS controlled diode and the second cell pitch is the pitch of the MOS transistor.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 1:
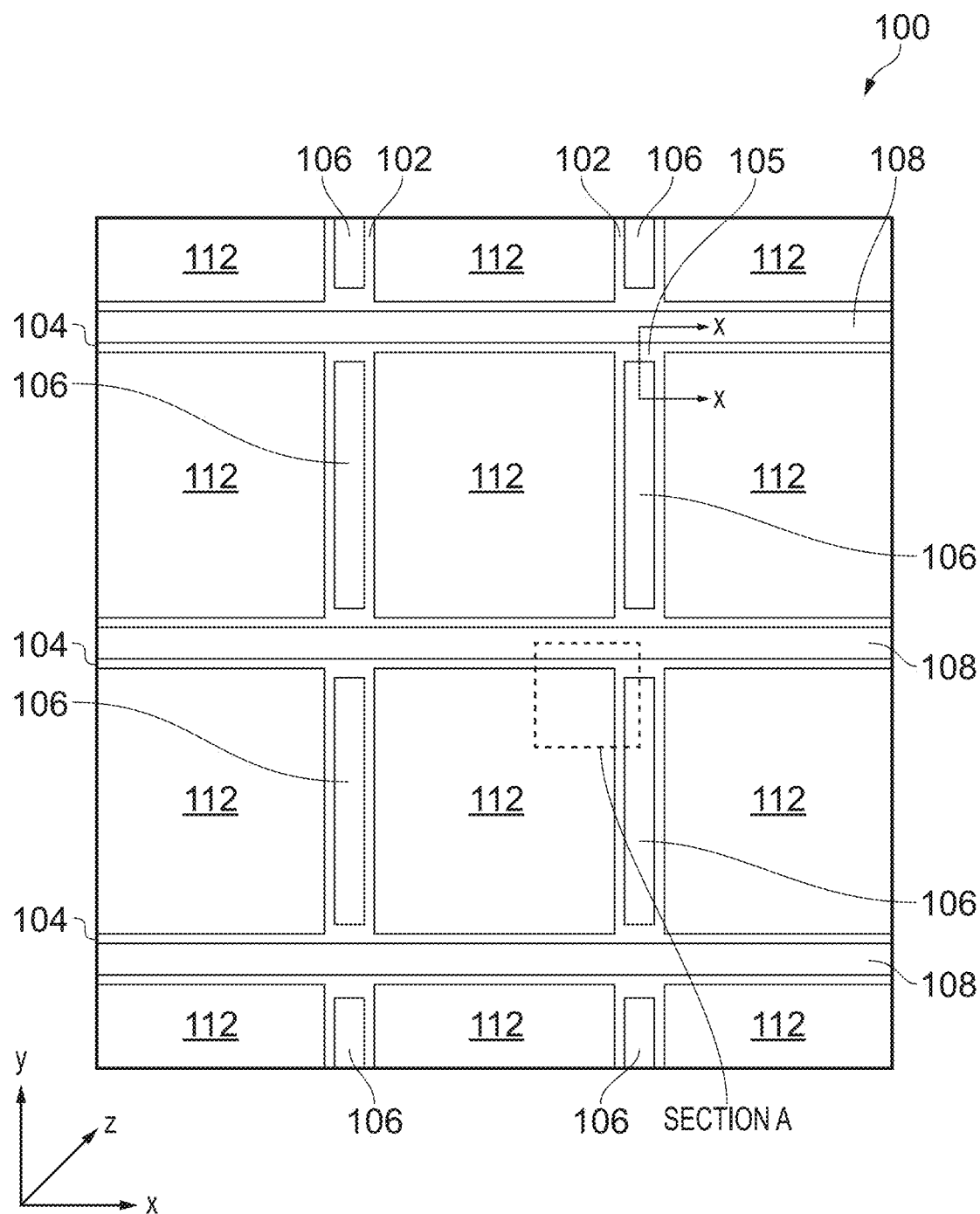
FIG. 1 illustrates a plan view of a combined MOS controlled diode and MOS transistor semiconductor device according to an embodiment.

A plan view of the trench structure of the combined MOS controlled diode (MCD) and MOS transistor semiconductor device 100 according to an embodiment is illustrated in FIG. 1. Details of the layer structure of the semiconductor device 100 will be discussed in more detail below with respect to FIGS. 2a and 2b. The semiconductor device 100 comprises a trench structure formed in a top surface thereof. The trench structure comprises orthogonally intersecting trenches extending into the layer structure of the semiconductor device 100. A first set of trenches 102 extends between opposing sides of the semiconductor device 100 in the y-direction (or vertically as illustrated in FIG. 1), and a second set of trenches 104 extends in the x-direction (or horizontally as illustrated in FIG. 1). In this way the skilled person will see that the layout of the first and second trenches form an n×m matrix structure, where n is the number of first trenches and m is the number of second trenches. In the example illustrated in FIG. 1, the matrix structure is a 2×3 matrix and the skilled person will appreciate that any appropriate number of first and second trenches may for the matrix structure.

Each of the first and second sets of trenches 102, 104 extend in the z-direction into the layer structure such that it extends from a top portion of the semiconductor device 100 into the semiconductor layer, and terminates in a drift region of the device. (as illustrated more clearly in FIGS. 2a and 2b). Adjacent trenches of the first set are parallel and spaced by a first pitch X, and adjacent trenches of the second set are parallel and spaced by a second pitch Y.

Figure 2A:
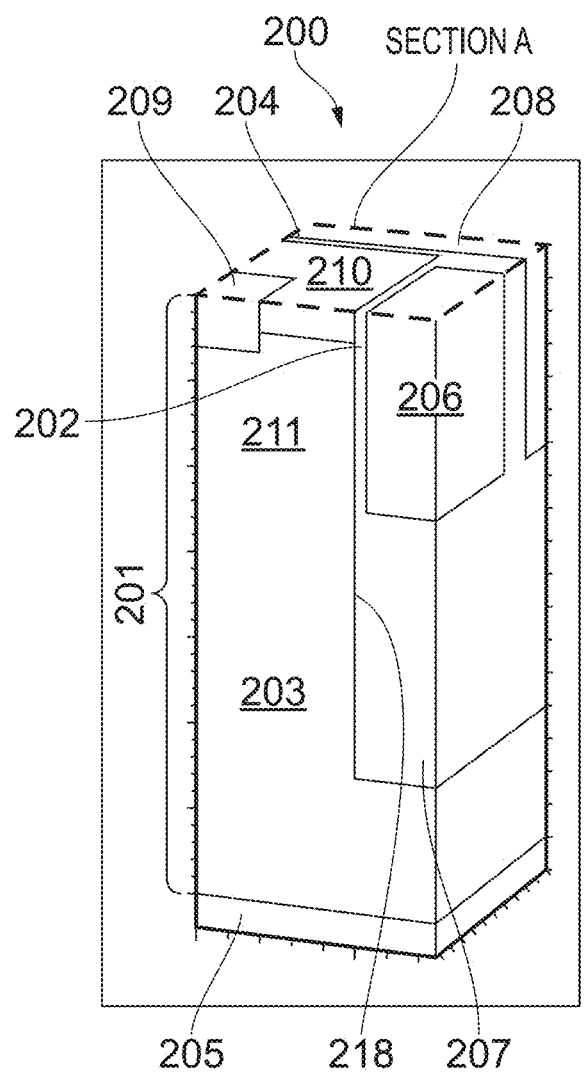
FIG. 2a illustrates a cross-sectional view of a combined MOS controlled diode and MOS transistor semiconductor device according to an embodiment.
Figure 2B:
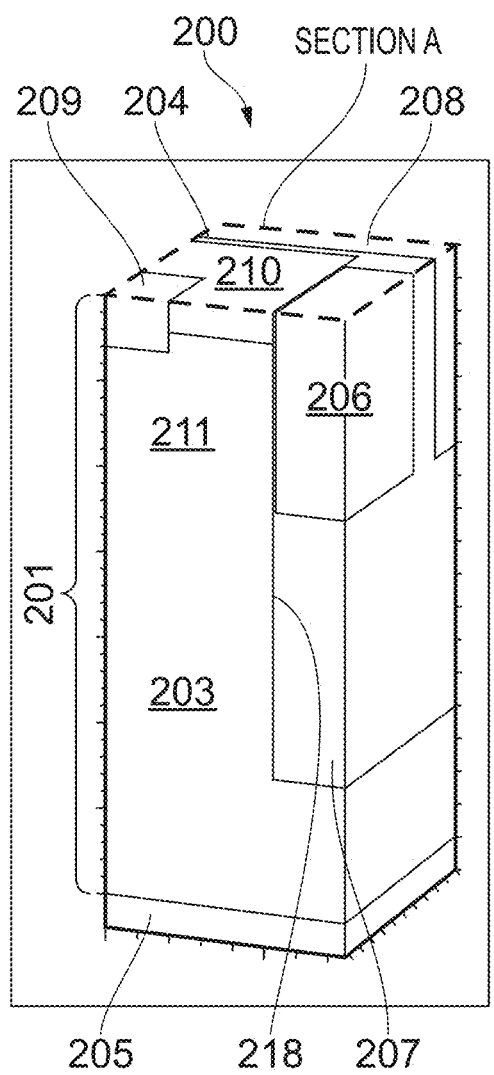
FIG. 2b illustrates a further cross-sectional view of a combined MOS controlled diode and MOS transistor semiconductor device according to an embodiment.

Each of the first set of trenches 102 and the second set of trenches 104 include an oxide material arranged therein (illustrated more clearly in FIGS. 2a and 2b). Typically, the geometry, such as depth and width, of the first set of trenches 102 and the second set of trenches 104 may be the same.

With regard to the arrangement of the second set of trenches 104, the oxide material comprises a Trench Bottom Oxide (TBO) is formed in the bottom (or base) each of the second set of trenches 104 trenches, a side wall oxide is formed on the side walls of the those trenches and a second electrode 108 is formed on top of the TBO and between the side wall oxides. In the case of the second set of trenches 104, the second electrode 108 formed therein extends continuously in the x-direction (or horizontally as illustrated in FIG. 1) across the semiconductor device 100. In this regard the second electrodes are gate electrodes 108 of the semiconductor device 100. The side wall oxide, trench bottom oxide and gate dielectric (not illustrated) collectively form a gate oxide to electrically isolate a gate electrode 108. In this way, the gate electrode 108 is arranged in the gate trench 108 and is surrounded by the respective oxides set out above.

With regard to the arrangement of the first set of trenches 102, and as with the second set of trenches as discussed above, and specifically the first electrodes 106 formed therein, a Trench Bottom Oxide is formed in the bottom (or base) each of the first set of trenches, and a side wall oxide is formed on the side walls of the first set of trenches. A first electrodes 106 are formed on top of the TBO and between the side wall oxides of the first trenches 102. The oxide materials of the first set of trenches 102 and the second set of trenches 104 may be the same material and may be formed simultaneously. Likewise, the thickness of the oxide materials 105 may be the same, which has the advantage of ease of processing, however different oxide material thickness are also possible.

As mentioned above, the first set of trenches 102 orthogonally intersect the second set of trenches 104 and in this regard the first electrodes 106 in the y-direction are separated into individual electrodes, isolated from the second electrodes and subsequent electrodes in the y-direction by the side wall oxide of second set of trenches. In this regard the first electrodes 106 are source electrodes 106 of the semiconductor device 100. The side wall oxide, trench bottom oxide and gate dielectric collectively form a dielectric to electrically isolate a source electrode 106. In this way, the gate electrode 106 is arranged in the source trench 102 and is surrounded by the respective oxides set out above. A source dielectric (not illustrated) may also be provided on the top surface of the source electrode. Typically, the source dielectric may be formed by patterning.

As illustrated in FIG. 1, the spacing between adjacent source trenches 102, which are substantially parallel, defines a pitch X which corresponds to the MCD pitch of the semiconductor device. In general the MCD utilises a MOSFET to control the injection of minority carriers during and before reverse recovery of the MOS diode, which occurs because the MCD has a lower Vsds, the forward voltage drop in the transistor (also known as Vf or the forward voltage) than the MOS cell, which enables fast switching speeds and subsequently less power loss (that is higher switching efficiency) during switching cycles.

The arrangement of FIG. 1 also provides for improvements such as lower leakage currents because in avalanche mode the avalanche current tends to flow through the cells (in this case the MCD cells) with the lower Vsds. Furthermore, the safe operating area of the device may be increased by locating the MCD cells in a certain area of the die so that during higher current event such as avalanche events the MCD cells conduct rather than the MOS cells. For example, in the case of a clip bonded device the MCD cells may be located under the area where the clip bond is made to the device. Likewise, in the case of a wire bonded device the MCD cells may be located under the area where the wire bond is made to the device.

Likewise the spacing between adjacent gate trenches 104 defines a pitch Y and this corresponds to the MOS pitch. This arrangement dissociates or decouples the MOS from the MCD and does not result in any loss of active area, because the MOS cell pitch and the MCD cell pitch can be specified independently of each other. In this regard the active area is the sum total of all mesa regions 112 of the device. The gate trenches 104 are perpendicular to the source trenches 102 and as a result the MCD cell pitch is perpendicular to the MOS cell pitch. This arrangement of gate trenches and source trenches forms a matrix of trenches and thus matrix of MESA regions 112.

A polysilicon source electrode of the MCD is connected to the source terminal and the polysilicon gate electrode of the MOS is connected to the gate terminal, as discussed in more detail below. The skilled person will see therefore the MCD and the MOS are not electrically connected. The gate electrodes are continuous along the length of the each of the gate trenches, and the source electrodes are split or discontinuous along the length of each of the source trenches. The source electrodes are split or divided by the gate electrode.

The MCD to MOS ratio, that is the number of MCD cells to MOS cells can be tailored to determine performance. For example, if the MOS cell pitch Y (that is the number of trenches per unit length) is constant but the MCD cell pitch X is reduced (that is more trenches per unit length) the ratio of MCD to MOS cells increases and device performance may be improved. Typically, the MCD pitch is tailored to improve dynamic switching (for example Qgd, Qgtot). It is possible to reduce the MOS pitch but this can have a detrimental effect on dynamic switching and $R_{DS(ON)}$.

However, in applications where dynamic switching is not an important consideration the MOS cell pitch Y may be reduced (that is increasing the number of MOS cells per unit length) to from and improve $R_{DS(ON)}$. As a result therefore, the skilled person will see that it is possible to define or tune device performance by appropriate selection MCD/MOS ratio.

The Vsds of the device is proportional to the amount or area of the MCD cells. Higher MCD area results in lower threshold voltage, Vgstx and thus reduced switching losses. In embodiments, the MCD trenches are perpendicular to the MOS trenches, such that the $R_{DS(ON)}$ of the device is not reduced. Dynamic performance may be optimised by varying the thickness of the sidewall gate oxide in the MCD cell. If the sidewall gate oxide is reduced, this has the effect of lowering the forward voltage Vsds, and this is more clearly illustrated with respect to FIG. 3 discussed below.

Turning now to FIGS. 2a and 2b, they each show the half-cell region taken through section A of the semiconductor device 100 of FIG. 1. The skilled person will appreciate the arrangement of FIGS. 2a and 2b are sections of a full cell and that the semiconductor device 100 may comprise one or more such cells, as illustrated for example in FIG. 1. The semiconductor device 200 as illustrated in FIGS. 2a and 2b may comprise a semiconductor layer 201 arranged on a semiconductor substrate 205. The semiconductor layer 201 comprises an n-type drift region 203 formed on an n-type semiconductor substrate 205 which collectively form a drain region of the semiconductor device 200. Whilst not illustrated in FIGS. 2a and 2b, the skilled person will understand that a drain contact may be formed on the semiconductor substrate 205 by any appropriate means.

The gate trenches 204 and the source trenches 202 are arranged to extend from a top portion of the semiconductor device 200 into the semiconductor layer 201, and terminating, in the drift region 203. For ease of integration and processing efficiency that the gate trenches 204 and the source trenches 202 may be formed by the same single trench etch process, such that the gate trenches 204 and the source trenches 202 ideally have the same depth and ideally same width. Different trench depths and widths are possible, however they are require more complicated processing steps and can result in inconsistencies in the trench oxide quality. A TBO 207 is arranged in the bottom (or base) of the gate trenches 204 and the source trenches 202. Likewise, side wall oxides 218 are arranged on the side walls of the gate trenches 204 and the source trenches 202. Whilst not illustrated there are also source dielectrics and a gate dielectrics formed on the top of each of the respective source trenches 202 and gate trenches 204. The source dielectrics and a gate dielectrics are formed of the same dielectric material a single processing step, but are then patterned to the appropriate geometry to form separate gate and source contacts.

The side wall oxides 218, trench bottom oxides (TBO) 207 and in the gate and source trenches collectively form dielectrics to electrically isolate the respective gate electrodes 208 and source electrodes 208 from the semiconductor layer. In addition the side wall oxides 218 formed intermediate the gate electrode 208 and source electrode 206 serves to isolate the gate electrode 208 from the source electrode 206. In this way, the gate electrode 208 is arranged in the gate trench 202, and the source electrode 206 is arranged in the source trench 204 and both the gate electrode 208 and the source electrode 206 are surrounded by the respective oxides 207, 218, as set out above.

The semiconductor device 200 also comprises a p-type body region 211 which, excluding a source region 210 discussed below, extends from a top major surface of the device to a depth corresponding to the side walls of the gate trenches 204 and the source trenches 202. In other words, the body region 211 may extend into the semiconductor device and terminates at or before the bottom of the gate trenches 204 and the source trenches 202. The body region 211 abut the gate trench 204 and the source trench 202 along respective lengths of the gate trench 204 and the source trench 202 ending, as mentioned above, at or before the bottom of the gate trench 204 and the source trench 202. In this way, the body region 211 abuts a source contact region 210 at an upper portion thereof and abuts the gate trench 204 and the source trench 202 at lower portions thereof. This allows for formation, by inversion, of the source to drain conduction channel of semiconductor device 200 during operation.

The MESA region discussed above with respect to FIG. 1 comprises from bottom to top, as viewed in either FIG. 2a or 2b, the semiconductor substrate 205, with the drift region 203 formed thereon, the body region 211 an ohmic contact region 209 formed adjacent the source contact region 210. The ohmic contact region 209 extends into the body region 211. The ohmic contact region and the source contact region 210 are shorted together via a source metallisation. For clarity the source metallisation is not illustrated in FIGS. 2a and 2b).

The MESA region plays no role in the MOS and MCD operation. The MOS is defined by the respective trench of the gate electrode 208 and the MCD is defined by the respective trench of the source electrode 206. For the MCD the source is connected to the polysilicon source electrode 206 and for the MOS the gate is connected to the polysilicon gate electrode 208.

Figure 3:
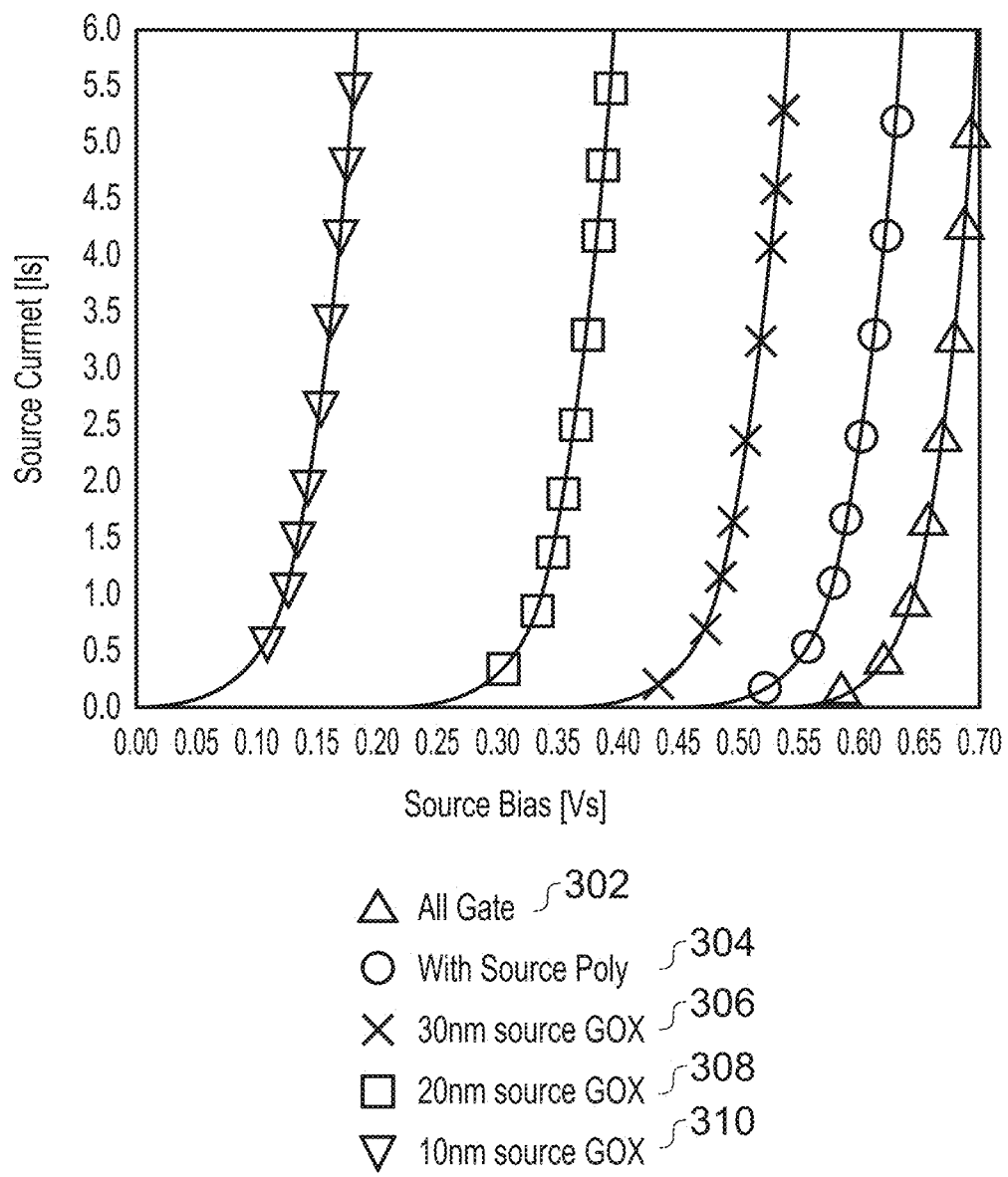
FIG. 3 illustrates source current (Isds) versus source voltage (Vsds) I-V plots for various gate oxide arrangements according to embodiments.

FIG. 3 illustrates the forward voltage drop Vsds versus the forward voltage current Isds of the MCD in the MESA for various MCD arrangements. For plot 302 illustrates the behaviour when there is no MCD, or in other words each of the trenches are connected to the gate, that is the gate electrode is connected to the source electrode by continuous polysilicon.

When the MCD is added, typically with a gate oxide thickness of 40 nm (see plot 304) consistent with embodiments described herein, Vsds is reduced compared to plot 302. As the gate oxide thickness is further reduced in the MCD cell for the same gate oxide thickness in the MOS cell, Vsds is further reduced as illustrated in plots 306, 308 and 310. As can be seen, the thinner the gate oxide (plot 310) the lower Vsds. As clearly shown in FIG. 3, the resistance of the drift region, which heavily dominates $R_{DS(ON)}$, that is the slope of Vsds to Isds and is constant for the each of the gate arrangements in FIG. 3, and the skilled person will clearly understand therefore that $R_{DS(ON)}$ effectively remains constant and is defined by the resistance of the drift region.

Figure 4:
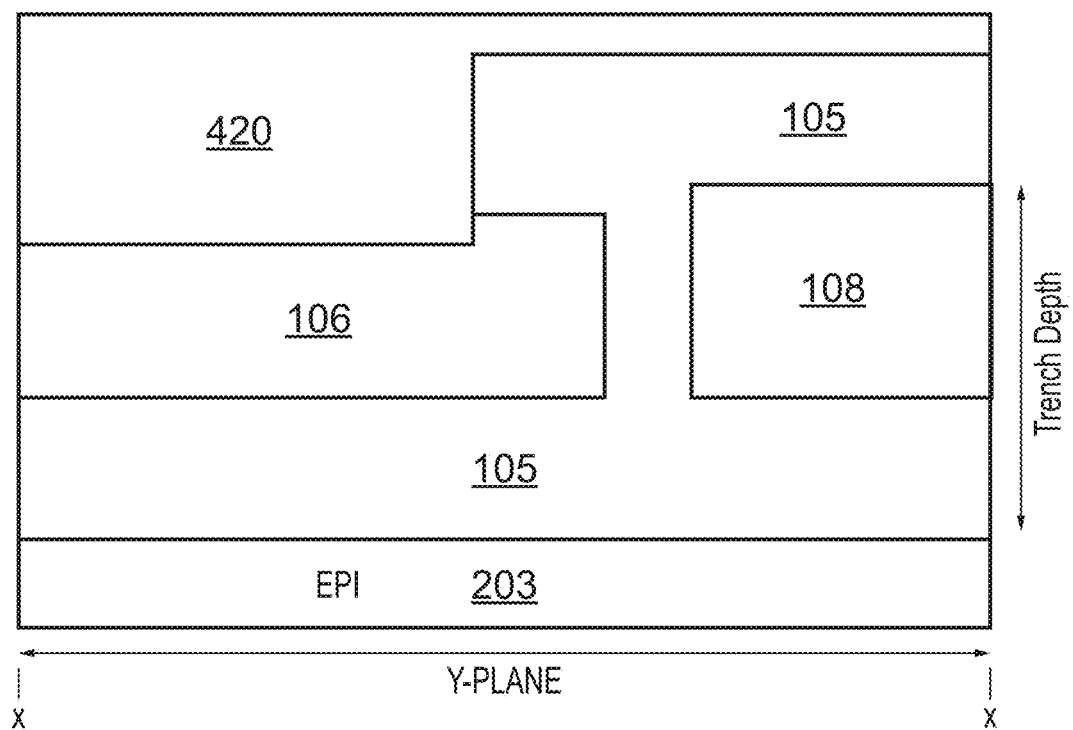
FIG. 4 illustrates a cross-section taken through line x-x of FIG. 1.

FIG. 4 is cross section taken on line X-X of FIG. 1. For consistency and ease of understanding the identical reference numerals to those of FIG. 1 will be used. As explained above with respect to FIG. 1, the gate electrodes 108 are separated from the source electrodes 106 by an oxide material 105 and the gate electrodes 108 and source electrodes are arranged in respective trenches which extend into the drift region 203 (illustrated in FIGS. 2a and 2b). A source contact metal 420 (not illustrated previously) is formed to directly contact to the source electrode 106 and be isolated from the gate electrodes 108 by the oxide material 105.

The semiconductor device according to the embodiments is manufactured according to the following process steps. The semiconductor layer 201 may be formed on a semiconductor substrate 205 using known techniques such as epitaxial growth or deposition. Typically, the semiconductor layer is formed of silicon and is formed of the same conductivity type as the semiconductor substrate, for example n-type. Following formation of the semiconductor layer, which defines the drift region 203 of the semiconductor device, the gate trenches 204 and the source trenches 202 are formed through the top major surface of the semiconductor layer forming the drift region 203.

As mentioned above the gate trenches 204 and the source trenches 202 are arranged to be orthogonal and are arranged to extend from a top portion of the semiconductor device 200 into the semiconductor layer 201, and terminating, in the drift region 203.

Following formation of the gate and source trenches 202, 204 an oxide layer is formed in gate and source trenches 202, 204 and the oxide may be planarised to the top of the respective trenches by, for example chemical mechanical polishing (CMP).

A first photolithography step may then be used to define the location of the gate electrodes 208 in the gate trenches 204 and the oxide material in the gate trenches 204 is etched to the required depth, that is the TBO 207 in the gate trenches 204. The gate electrodes 208 may then be formed in the gate trenches 204 by any suitable gate polysilicon process. Following etching of the gate trenches 204 and the gate electrodes 208 a PS screen oxide may be formed.

A second photolithography step may then be used to define the location of the source electrodes 206 in the source trenches 202 and the oxide material in the source trenches 202 is etched to the required depth, that is the that is the TBO 207 in the source trenches 204. The source electrodes 206 may then be formed in the source trenches 204 by any suitable gate polysilicon process.

The oxides in the gate trenches 204 and the source trenches 202 may be etched to the same depth such that the gate and source electrode extend to the same depth. Alternatively, the oxides in the gate trenches 204 and the source trenches 202 may be etched to the different depths. Following this the MCD oxide is grown where the MCD oxide is the same as the gate oxide if the thickness is the same or a separately grown oxide if the oxide is thinner.

The source electrodes 206 may then be formed in the source trenches 204 by any suitable gate polysilicon process.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A combined MOS controlled diode (MCD) and MOS transistor semiconductor device, comprising:
   an epitaxial semiconductor layer arranged on a semiconductor substrate;
   a matrix of trenches formed in the epitaxial layer, the matrix of trenches comprising a first plurality of spaced apart parallel trenches defining a cell pitch of the MOS controlled diode and a second plurality of spaced apart parallel trenches defining a cell pitch of the MOS transistor, wherein each of the first plurality of parallel trenches is orthogonal to each of the second plurality of parallel trenches;
   gate electrodes arranged in each of the first plurality of spaced apart parallel trenches; and
   source electrodes arranged in each of the second plurality of spaced apart parallel trenches.

2. The semiconductor device of claim 1, further comprising a first oxide layer formed in the first plurality of spaced apart parallel trenches and a second oxide layer formed in the second plurality of spaced apart parallel trenches.

3. The semiconductor device of claim 2, wherein the gate electrodes are insulated from the epitaxial semiconductor layer by the first oxide layer and the source electrodes are insulated from the epitaxial semiconductor layer by second oxide layer.

4. The semiconductor device of claim 3, wherein the gate electrodes are insulated from the source electrodes by the first oxide layer and the second oxide layer.

5. The semiconductor device of claim 3, wherein the gate electrodes are continuous along a length of each of the first plurality of spaced apart parallel trenches, and the source electrodes are split along a length of each of the second plurality of spaced apart parallel trenches.

6. The semiconductor device of claim 2, wherein the gate electrodes are insulated from the source electrodes by the first oxide layer and the second oxide layer.

7. The semiconductor device of claim 6, wherein the gate electrodes are continuous along a length of each of the first plurality of spaced apart parallel trenches, and the source electrodes are split along a length of each of the second plurality of spaced apart parallel trenches.

8. The semiconductor device of claim 2, wherein the gate electrodes are continuous along a length of each of the first plurality of spaced apart parallel trenches, and the source electrodes are split along a length of each of the second plurality of spaced apart parallel trenches.

9. The semiconductor device of claim 1, wherein the gate electrodes are continuous along a length of each of the first plurality of spaced apart parallel trenches, and the source electrodes are split along a length of each of the second plurality of spaced apart parallel trenches.

10. A method of manufacturing a combined MOS controlled diode (MCD) and MOS transistor semiconductor device, the method comprising:
forming an epitaxial semiconductor layer on a semiconductor substrate;
forming a matrix of trenches in the epitaxial layer, the matrix of trenches comprising a first plurality of spaced apart parallel trenches to define a first cell pitch the MOS controlled diode and a second plurality of spaced apart parallel trenches to define a second cell pitch of the MOS transistor, wherein each of the first plurality of parallel trenches is orthogonal to each of the second plurality of parallel trenches;
forming gate electrodes in each of the first plurality of spaced apart parallel trenches;
and
forming source electrodes in each of the second plurality of spaced apart parallel trenches.

11. The method of claim 10, further comprising forming a first oxide layer in the first plurality of spaced apart parallel trenches and forming a second oxide layer in the second plurality of spaced apart parallel trenches.

12. The method of claim 11, wherein the gate electrodes are formed to be insulated from the epitaxial semiconductor layer by the first oxide layer and the source electrodes are formed to be insulated from the epitaxial semiconductor layer by second oxide layer.

13. The method of claim 12, wherein the gate electrodes are formed to be insulated from the source electrodes by the first oxide layer and the second oxide layer.

14. The method of claim 11, wherein the gate electrodes are formed to be insulated from the source electrodes by the first oxide layer and the second oxide layer.

15. The method of claim 10, comprising forming the gate electrodes to be continuous along a length of each of the first plurality of spaced apart parallel trenches, and forming the source electrodes to be split along a length of each of the second plurality of spaced apart parallel trenches.

16. The method of claim 10, comprising forming the first plurality of spaced apart parallel trenches to define a first cell pitch and forming the second plurality of spaced apart parallel trenches to define a second cell pitch.

* * * * *